(12) United States Patent
Wu et al.

(10) Patent No.: US 10,190,031 B2
(45) Date of Patent: Jan. 29, 2019

(54) THERMALLY CONDUCTIVE INTERFACE COMPOSITION AND USE THEREOF

(71) Applicants: Jiali Wu, Yorktown Heights, NY (US); Kellsie Shan, Carmel, NY (US); Lei Shan, Carmel, NY (US)

(72) Inventors: Jiali Wu, Yorktown Heights, NY (US); Kellsie Shan, Carmel, NY (US); Lei Shan, Carmel, NY (US)

(73) Assignees: Jiali Wu, Yorktown Heights, NY (US); Kellsie Shan, Carmel, NY (US)

( * ) Notice: Subject to any disclaimer, the term of this patent is extended or adjusted under 35 U.S.C. 154(b) by 171 days.

(21) Appl. No.: 15/174,968

(22) Filed: Jun. 6, 2016

(65) Prior Publication Data

US 2017/0349801 A1 Dec. 7, 2017

(51) Int. Cl.
| | |
|---|---|
| *C09K 5/14* | (2006.01) |
| *C08L 83/04* | (2006.01) |
| *H05K 7/20* | (2006.01) |
| *C08K 3/04* | (2006.01) |
| *C08K 3/20* | (2006.01) |
| *C08K 3/22* | (2006.01) |
| *C08K 3/08* | (2006.01) |
| *C08K 5/5415* | (2006.01) |

(52) U.S. Cl.
CPC .................. *C09K 5/14* (2013.01); *C08K 3/04* (2013.01); *C08K 3/20* (2013.01); *C08L 83/04* (2013.01); *H05K 7/2039* (2013.01); *C08K 5/5415* (2013.01); *C08K 2003/0812* (2013.01); *C08K 2003/2227* (2013.01); *C08K 2201/005* (2013.01)

(58) Field of Classification Search
USPC .......................................................... 524/588
See application file for complete search history.

(56) References Cited

U.S. PATENT DOCUMENTS

| | | | | |
|---|---|---|---|---|
| 6,380,301 | B1 * | 4/2002 | Enami .................. | C08K 5/5419 428/405 |
| 2011/0311767 | A1 * | 12/2011 | Elahee ..................... | C08K 5/11 428/138 |
| 2013/0065999 | A1 * | 3/2013 | Takanashi ............. | H01L 23/295 524/268 |
| 2014/0293546 | A1 * | 10/2014 | Wu ........................ | C09K 5/14 361/715 |
| 2015/0148273 | A1 * | 5/2015 | Matsumoto ............. | C08L 83/04 508/139 |
| 2016/0009954 | A1 * | 1/2016 | Hanson .................... | C08K 3/36 29/825 |
| 2016/0304673 | A1 * | 10/2016 | Kusunoki .............. | C08G 77/20 |
| 2017/0022326 | A1 * | 1/2017 | Enami ..................... | C08L 83/04 |
| 2017/0372815 | A1 * | 12/2017 | Grau ........................ | H01B 3/46 |
| 2018/0030327 | A1 * | 2/2018 | Zhang ..................... | C09K 5/14 |

\* cited by examiner

*Primary Examiner* — Marc S Zimmer

(57) ABSTRACT

A thermally conductive interface composition is interposed between a heat generating component and a heat dissipating component. To meet escalated heat dissipation for performance demanding devices, a thermally conductive interface composition comprises (A) A linear alkenyl organopolysiloxane containing a silicon-bonded alkenyl-terminated group or groups, (B) A branched alkenyl organopolysiloxane containing at least two silicon-bonded alkenyl groups, (C) thermally conductive fillers in a ternary particle size mixture, (D) An organohydrogenpolysiloxane containing at least two Si—H terminated groups, (E) An addition reaction catalyst, (F) A hydroxy group-containing siloxane, (G) Alkoxy group-containing siloxanes.

3 Claims, 2 Drawing Sheets

THERMALLY CONDUCTIVE INTERFACE COMPOSITION AND USE THEREOF

BACKGROUND

Electronic components such as multi-core processor generate heat during operation and the heat needs to be dissipated efficiently for the device to function properly. A common expedient for this purpose is to transfer heat from electronic component (e.g. FIG. 1-5, FIG. 2-5) to a heat spreader (e.g. FIG. 1-2, FIG. 2-2), and then to heat sink (e.g. FIG. 1-1, FIG. 2-1) through an integrated thermal path, which was established by attaching a heat spreader directly on the electronic component, and then a heat sink on the heat spreader using thermally conductive interface materials (FIG. 1-3, 4; FIG. 2-3, 4). Effectiveness of heat dissipation is dominated by thermal conductivity and mechanical integrity of the interface materials.

Due to the relentless pursuit of computing performance and functionality, improving heat dissipation becomes one of the central challenge issues. The recent trend in microprocessor architecture has been to increase the number of transistors, shrink processor size, and increase clock speeds in order to meet the market demand. As a result, the high-end microelectronic components are experiencing ever growing total power dissipation and heat fluxes, which increase the demand for effective means of heat dissipation.

Thermally conductive interface material plays a key role in terms of thermal dissipation efficacy of integrated electronic component packages, such as single-chip modules (SCMs) and multi-chip modules (MCMs) as shown in FIG. 1 and FIG. 2. Electronic components such as chips are bonded to substrates (FIG. 1-8, FIG. 2-8) via flip chip interconnect or other means of interconnection (FIG. 1-6, FIG. 2-6) to reduce package size and increase module electrical and thermal performance. The nominal thickness of bonding interfaces (also called bond line thickness—BLT, FIG. 1-3, 4 and FIG. 2-3, 4) filled with thermal interface material is typically about 3000 um and below. High end SCMs or MCMs are commonly assembled onto functional substrates via ball grid array (BGA, FIG. 1-7, FIG. 2-7) and other interconnection means to form system package. The integrated electronic component packages, such as SCMs or MCMs, see multiple thermal excursions at a peak temperature as high as 265 C during package assembly. For organic electronic component packages, thermal interface material experiences tremendous mechanical stress during module assembly processes. To retain an intimate interface contact as well as to absorb mechanical stress, a thermally conductive interface material has to be gel like with low modulus but high thermal conductivity. The present invention provides a capable thermally conductive composition which is interposed between any heat generating component and heat dissipation component to satisfies the aforementioned stringent characteristics in the application field of electronics packaging, LED, solar cell, image sensors, MEMS, wireless network devices, photovoltaic, and medical devices, auto electronics, etc.

There have been known a variety of polysiloxane (or silicone) based thermally conductive composition, including those which comprising an oranopolysioxane containing a silicon bonded vinyl group and organopolysiloxane containing a silicon bonded hydrogen. However, due to the further increase in power assumption, which results in high heat density on electronic component, a sufficient heat dissipation effect cannot be obtained using traditional thermally conductive material. Furthermore, Insufficient mechanical compliance of cured material could result in cohesive fracture introduced thermal failure.

SUMMARY OF INVENTION

Figure 1:
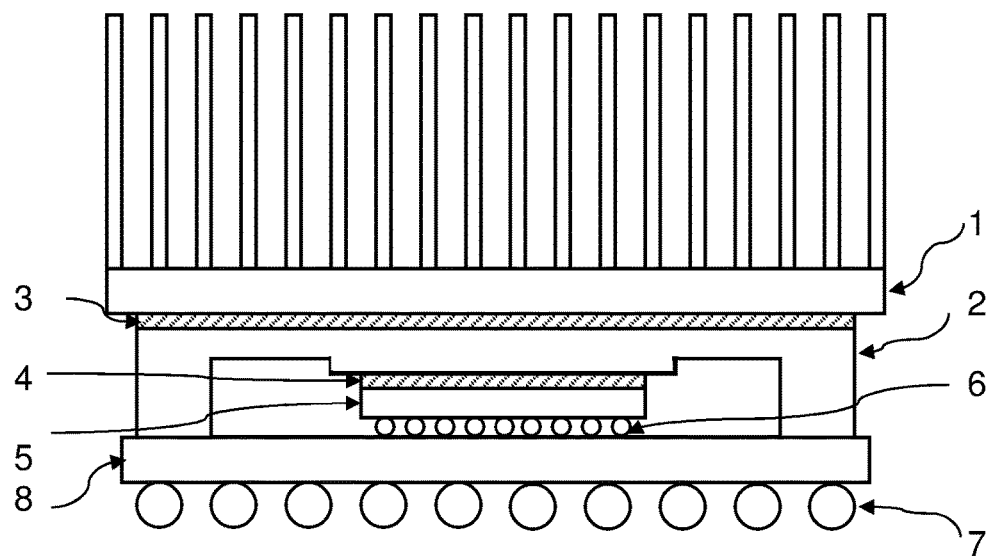
FIG. 1 is an integrated Single Chip Module (SCM) with a heat spreader and a sink.

It is accordingly an object of this composition invention to provide a gel-forming silicone composition excelling thermal conductivity with low viscosity, low modulus, flexibility, and not prone to adhesive or cohesive fracture. To achieve this goal, the present invention comprises a curable silicone based composition with thermally conductive filler loading. Before cure, the materials have properties similar to grease or paste, they have high thermal conductivity, low surface tension, and conform well onto surface irregularities upon dispense and assembly, which contributes to thermal contact resistance minimization. After cure, the crosslink reaction provides cohesive strength to circumvent the pump-out issues exhibited by grease or paste during temperature cycling. Their modulus is low that the material can dissipate thermal stress and prevent interfacial delamination or cohesive fracture.

The composition of present invention comprising (note: polysiloxane and silicone are used interchangeably):

(A) A Linear Alkenyl Organopolysiloxane

A linear alkenyl organopolysiloxane containing a silicon-bonded alkenyl-terminated group or groups in an average amount of about 0.0001 to 5 mol %, preferred from 0.1-1 mol % based on the amount of all silicon-bonded organic groups contained per molecule. The alkenyl group containing organopolysiloxane having the following composition (1):

$$R^1 + (R^2)_a(R^3)_b SiO_{(4-a-b)/2} + _n SiR^2 R^3 R^1 \quad (1)$$

wherein $R^1$ is an alkenyl group, or substituted or unsubstituted monovalent carbonhydrogen groups, $R^1$ could be the same or different. $R^2$ and $R^3$ are substituted or unsubstituted monovalent carbonhydrogen groups, $R^2$ or $R^3$ could be the same or different. a and b are integers having values such that a $0 \leq a < 3$, b=2−a. n is a integer from 5-500.

In the above formula (1), $R^1$ is preferably an alkenyl group, substituted or unsubstituted monovalent carbonhydrogen groups of from 2 to 8 carbons. Specific examples include vinyl, allyl, 1-butenyl and 1-hexenyl groups, and methyl, ethyl, propyl, isopropyl, and the like.

In the above formula (1), $R^2$ and $R^3$ are preferably substituted or unsubstituted monovalent hydrogencarbon groups. Examples of $R^2$ and $R^3$ include alkyl groups such as methyl, ethyl, propyl, isopropyl, butyl, octyl, and the likes; cycloalkyl groups such as cyclopentyl, cyclohexyl, cyclobutyl and the like; aryl groups such as phenyl, xylyl, naphthyl, and the likes. Aralkyl groups such as benzyl, phenylethyl, phenlpropyl, and the likes; and groups derived from these hydrogen groups by substitution of part or all of the carbon-bonded hydrogen atoms in these hydrogen groups with a halogen atom, cyano group or the likes, such as chloromethyl, trifluoropropyl, cholophenyl, diflorophenyl, and the likes. Alkylene groups may be formed from $R^2$ and $R^3$, for example, ethylene, trimethylene, methylmethylene, tetramethylene, and hexamethylene groups and the likes.

The component (A) preferably has a viscosity at 25 C in the range of 50-1500 cP to ensure that the composition mixture obtained will have a suitable fluidity before cure and exhibit suitable physical properties after cure where it is used as thermally conductive interface materials.

(B) A Branched Alkenyl Organopolysiloxane

A branched alkenyl organopolysiloxane containing silicon-bonded alkenyl groups in an average amount of about 0.01 to 1 mol %, preferably from 0.1-0.5 mol % based on the amount of all silicon-bonded organic groups contained per molecule. Each organopolysiloxane molecular has at least 2 alkenyl groups. Each alkenyl groups is bonded to a silicon atom located at an intermediate position and a terminal position of the molecular chain. The alkenyl group containing organopolysiloxane having the following average composition formula (2):

$$(R^4)_c(R^5)_d SiO_{(4-c-d)/2} \qquad (2)$$

wherein $R^4$ is an alkenyl group, $R^5$ is a substituted or unsubstituted monovalent harbonhydrogen groups, and c and d have values such that $0<d<3$, and $0.001 \leq c/(c+d) \leq 0.003$.

In the above formula (2), $R^4$ is preferably an alkenyl group of from 2 to 8 carbons. Specific examples include vinyl, allyl, 1-butenyl and 1-hexenyl groups and the like.

In the above formula (2), $R^5$ is preferably substituted or unsubstituted monovalent carbonhydrogen groups. Examples of $R^5$ include alkyl groups such as methyl, ethyl, propyl, isopropyl, butyl, octyl, and the likes; cycloalkyl groups such as cyclopentyl, cyclohexyl, cyclobutyl and the likes; aryl groups such as phenyl, xylyl, naphthyl, and the likes. Aralkyl groups such as benzyl, phenylethyl, phenlpropyl, and the likes; and groups derived from these hydrogen groups by substitution of part or all of the carbon-bonded hydrogen atoms in these hydrogen groups with a halogen atom, cyano group or the likes, such as chloromethyl, trifluoropropyl, cholophenyl, diflorophenyl, and the likes. Alkylene groups may be formed from two $R^5$'s include, for example, ethylene, trimethylene, methylmethylene, tetramethylene, and hexamethylene groups and the likes.

The component (B) preferably has a viscosity at 25 C in the range of 50-3000 cP to ensure the composition obtained will have a suitable fluidity before cure and exhibit suitable elasticity after cure.

Weight or volume ratio of compound (A) to (B) is from 20:1 to 1:20, preferably from 10:1 to 1:5.

(C) Thermally Conductive Fillers in a Ternary Particle Size Mixture

There is a wide range of thermally conductive fillers can be used in the practice of the compositions of present invention. Examples of these fillers include metals, such as aluminum, copper, gold, silver, silver coated aluminum, and the like; non-metals, such as aluminum oxide, aluminum nitride, silicon carbide, diamond, zinc oxide, boron nitride, zinc nitride, graphene, carbon black, carbon fibers, barium titanate, zirconium nitride, titanium nitride, silica, fumed silica, and the like; alloys and any combinations thereof. Surface of the thermally conductive fillers are rendered hydrophobic by treatment with organopolysiloxane, organosiloxane, organopolysilane, organosilane, hydroxyl stearic acid ester, or other types of dispersant.

A combined particle size mixture of thermally conductive filler, such as binary particle size, is commonly adopted for the increase of filler packing density and so to the thermal conductivity. In present invention, a ternary particle size mixture of thermally conductive fillers is used to maximize the filler loading percentage while maintain relative low viscosity compared with compositions at the same filler loading volume percentages. Large particle size is in the range of 50-500 um, small particle size is in the range of 0.5-200 um, nanoparticle size is in the range of 10-2000 nm. Thermally conductive filler loading volume percentage in thermally conductive interface composite is in the range of 20-92%, preferred from 30-85%.

In present invention, a mixture of thermally conductive filler composition is mixed with organic vehicle to enhance the thermal conductivity. To lower the relative viscosity of the mixture at the same filler loading percent. Fillers in spherical or cubic octahedral shape are preferred. The average size of large particle must be selected in a range that balances bonding interface thickness and thermal conductivity effectiveness for an interface material. Addition of small particles are to increase the particle packing density, so as to the thermal conductivity. In addition, the effect of adding nanoparticle is to disentangle polymeric chain and reduce contact interface between micro size particles and polymer liquid matrix, which leads to further increasing of filler loading in thermally conductive mixtures with marginal viscosity budget.

An organosilane is optionally to be used to pretreat thermally conductive fillers to promote the bonding strength between thermally conductive filler (C) and silicone resin of component (A), (B) and (D). Alkenyl-contained silanes are preferred then others. An appropriate amount of alkenyl-contained silane blended is 0.0001-3% of total weight of component (A) and (B). Less than 0.01% renders insufficient adhesion and more than 5% causes hardening of silicone composition.

(D) Organohydrogenpolysiloxane

An organohydrogenpolysiloxane containing at least two Si—H terminated groups per molecule. It acts as cross-linker agent to react with alkenyl group in component (A) and (B) to form gel-like polymer with low cross-link density. The SiH may present at terminal or intermediate positions of the molecule. The average composition formula contained in orgaohydrogenpolysiloxane is (3):

$$(R^6)_e H_f SiO_{(4-e-f)/2} \qquad (3)$$

Wherein $R^6$ is a substituted or unsubstituted monovalent hydrocarbon group, and e and f have values such that $0<e \leq 3$, $0 \leq f<2$, and $1 \leq e+f \leq 3$, $0.0001<f/(e+f)<0.5$. The compounds may have one or combined liner, branched and cyclic structures.

In the above formula (3), two $R^6$'s may connected to form a alkylene group. $R^6$ groups include, for example, the groups mentioned above as component $R^2$. Linear organohydrogenpolysiloxane with Si bonded hydrogen group or groups in a viscosity no greater than 1000 cP at 25 C is preferable for composition with low fluidity consideration.

For ensuring the gel-like composition post cure without mechanical fracture, the amount of component (D) is preferable as such to provide from 0.5-0.8 moles of SiH groups per mole of alkenyl groups in component (A) and (B).

(E) An Addition Reaction Catalyst

The addition reaction catalyst for the present invention can be any catalyst promotes the hydrosilylation reaction between component (A) (B) and (D). Examples include platinum chloride, chloroplatinic acid, a complex of chloroplatinic acid and an olefin or vinylsiloxane, platinum bisacetoacetate and the like. The blending amount of component (E) cab be adjusted according to desired curing rate. The preferable amount of platinum in platinum compound (E) for present invention falls in a range of 0.01-600 ppm to the total amount of the curable silicone composition of (A), (B) and (D).

A reaction inhibitor for suppressing catalytic activity of component (E) at room temperature for thereby extending the shelf life and pot life of the thermally conductive interface material of present invention. Example of reaction inhibitor are acetylenic alcohols such as 3, 5-dimethyl-1-hexyn-3-ol, 2-methyl-3-hexyn-2-ol, 3-methyl-3-penetene-1-yne, 1-ethynylcyclohexanol, or methylvinylsiloxane cyclic compounds, or an organic nitrogen compounds. On use, the inhibitor may be diluted with organic solvent such as toluene, xylene or isopropyl alcohol in order to improve its dispersion in the silicone resin.

(F) A Hydroxyl Group-Containing Organopolysiloxane

A hydroxyl group-contained organopolysiloxane has at least one per molecule of hydroxyl group attached directly to a silicon atom, having an average composition represented in formula (4). $R^7$ in the formula are the same or different groups selected from monovalent organic groups. $1.5 \leq g+h \leq 2.5$ and $0.0001 \leq g/(g+h) \leq 0.5$. $R^7$ is monovalent saturated or unsaturated hydrocarbon groups of 1-100C, such as alkyl groups (e.g., methyl, ethyl, propyl, butyl, hexyl, octyl, decyl, tetradecyl, etc.), cycloalkyl groups (e.g., cyclohexyl), alkenyl groups (e.g., vinyl, allyl, etc.), aryl groups (e.g., phenyl, naphthyl, tolyl, etc.), and groups formed by substituting part or all of the hydrogen atoms attached to carbon atoms in the above mentioned groups.

$$R^7_g(OH)_h SiO_{(4-g-h)/2} \quad (4)$$

The hydroxyl group-containing organopolysilxanes as mentioned above may have any of linear, branched and cyclic structures, and two or more of those organopolysiloxane different in structure can be used as a mixture.

Component (F) has a potential of increasing cross-link density of the present composition. The desirable amount of hydroxyl group-containing organopolysiloxane is in 0.0001-5% of the weight of component (A) and (B) combined.

(G) Alkoxy Group-Containing Siloxanes

An alkoxysiloxane serves as a wetting agent to promote miscibility of thermally conductive particles (C) and silicone resin of component (A), (B) and (D). The alkoxysiloxanes are presented by average formula (5). $R^8$ and $R^9$ groups in the formula may be the same or different, and each $R^8$ or $R^9$ group represents a unsubstituted or substituted monovalent hydrocarbon group including, for examples, the groups mentioned above as component $R^2$.

$$(R^8O)_p SiR^9_{3-p}[OSiR^8_2]_n(OR^8)_q R^9_{3-q} \quad (5)$$

Among these groups, 1-3C alkyl groups are preferred over the others. In the above formula, p is an integer of 1, 2 or 3, q is an integer of 0, 1, 2 or 3, n is an integer of 1-150. Examples of alkoxysiloxane are $Me_3SiO(SiMe_2O)_{45}SiMe(OMe)_2$, $Si[OSiMe(OMe)_2]_4$, $(MeO)_2MeSi[OSiMe(OMe)_2]_2$, $(EtO)_3Si[SiO(Me)_2]_{32}Me_3$, $[ButOME]_2[Si(Me)_2]_{10}$, $(MeO)_3SiO(SiOMe_2)_{20}Si(OMe)_3$, and etc.

An appropriate amount of alkoxysiloxane blended is 0.001-5% of total weight of component (C). Component (G) preferred consists of at least two alkoxysiloxanes whose n value differ by at least 15. The proportion of the individual alkoxysiloxane making up component (G) is not restricted. The weight ratio of alkoxysiloxane with larger n value and the alkoxysiloxane with small n value is preferably from 15:1 to 1:15.

A thermally conductive interface composition of silicone based comprises 10-95 vol % (volume percentage) thermally conductive fillers, preferred 20-90 vol %. A ternary particle size mixture are loaded into an aforementioned organic composition based on a balance of interface thickness, viscosity, modulus and thermal conductivity.

The thermally conductive interface composition of present invention can be cured at 80 C to 150 C with varied time period. The complex storage modulus of thermally conductive interface composition cured at 125 C for 30 min is less than 300 kPa measured at a 10% strain displacement shear condition at 125 C.

Figure 2:
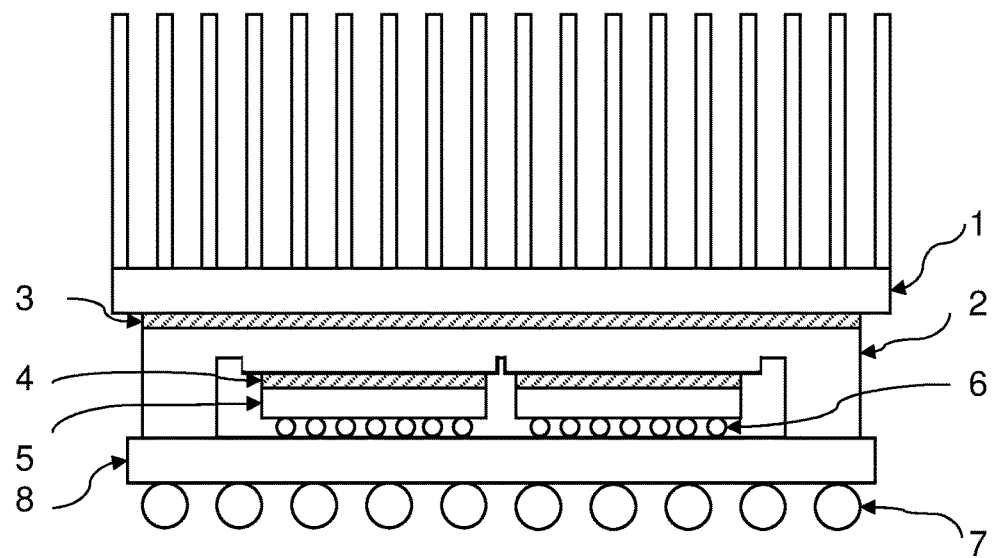
FIG. 2 is an integrated Multi Chip Module (MCM) with a heat spreader and a sink.

In a semiconductor packaging and integration application, the thermally conductive interface composition is applied between a silicon chip or chips and heat spreader (shown in FIG. 1-4, FIG. 2-4), or heat spreader and heatsink (shown in FIG. 1-3, FIG. 2-3), but not limited to so. In the application field, the thermally conductive interface composition serves as a heat transfer media to dissipate heat from chip to the heat spreader (FIG. 1-2, FIG. 2-2), and then to the heatsink (FIG. 1-1, FIG. 2-1).

A typical thickness of thermal interface material is about 100-5000 um. The thermally conductive interface composition presented in this invention can be used in a thickness range of 10-5000 um, preferred in a thickness range of 15-500 um with a thermal conductivity in the range of 1.0-8.0 w/k·m. A thickness less than 10 um bears limited tolerance of stress introduced disposition and results in delamination inside the thermal interface material, whereas thicker than 5000 um generates a substantial thermal resistance which may exacerbate thermal dissipation efficacy.

Mixing, Curing and Thermal Conductivity Measurement

In preparing a thermally conductive interface composition of present invention, the components (A) to (G) as mentioned above are mixed with a planetary mixer, three-roll mill, three-rod kneader, or other type of blender at 25 C or a raised temperature up to 60 C. The thoroughly mixed composition can be cured at a temperature from 80 C to 150 C. The cured thermally conductive interface composition has a complex storage modulus less 300 kPa under a 10% strain displacement shear condition at 125 C.

Thermal conductivity of the interface composition of present invention was measured using NanoFlash thermal conductivity analyzer. A layer of the thermally conductive interface composition with a thickness of 75 um was sandwiched between two circular aluminum plates of diameter 12.6 mm and thickness 2 mm. the sample was applied by a pressure in the range of 20-100 psi at 25 C for 15 min and then subjected to 125 C for 30 min.

EXAMPLES

The raw materials for examples 1-6 were uniformly mixed according to the amounts as given in table I.

The compounds used as component (A) are A-1 and A-2. They are linear alkenyl-terminated organopolysiloxane represented on the average by the formula;

$$(ViMe_2SiO_{0.5})_{1.2}(Me_2SiO)_{138.2} \quad \text{A-1}$$

$$(ViMe_2SiO_{0.5})_{1.3}(Me_2SiO)_{187.3}(Me_3SiO_{0.5})_{1.5}(MeSiO_{1.5})_{2.0}. \quad \text{A-2}$$

wherein Me stands for the methyl group and Vi stands for the vinyl group. A-1 has vinyl group 0.43 mol %, viscosity 280 cP. A-2 has vinyl group mole 0.45% and viscosity 310 cP.

The compounds used as component (B) are B-1 to B-2. They are branched alkenyl-group containing organopolysiloxane represented on the average by formula:

$(Me_3SiO_{0.5})_{0.75}(MeViSiO)_{1.5}(Me_2SiO)_{40}$     B-1

$(Me_3SiO_{0.5})_{1.0}(MeViSiO)_{1.7}(Me_2SiO)_{79}$     B-2 wherein B-1 having vinyl group 0.30 mol %, viscosity 450 cP. B-2 having vinyl group 0.35 mole % and viscosity 550 cP.

The thermally conductive fillers used as component C are diamond, aluminum, and alumina. C-1 is diamond with particle size from 30-100 um. C-2 is aluminum with particle size from 0.5-20 um, C-3 is alumina with particle size 50-2000 nm.

The compounds used as component (D) are D-1 and D-2. They are organohydropolysiloxane represented on the average by formula:

$(HMe_2SiO_{0.5})_{2.0}(Me_2SiO)_{16}$     D-1

$(HMe_2SiO_{0.5})_{2.0}(Me_2SiO)_{32}(Me_3SiO_{0.5})_{1.0}$     D-2 wherein D-1 has a viscosity of 18 cP, and D-2 has a viscosity of 22 cP.

The compound used as component (E) is a catalyst of chloroplatinic acid-vinylsiloxane complex.

The compound used as component (F) is hydroxyl polysiloxane represented on the average formulae:

$OH(Me_2SiO)_{100}(SiMe_3)$ wherein F has a viscosity of 220 cP.

The compounds used as component (G) are G-1 and G-2. They are alkoxypolysiloxane represented on the average by formula:

$Me_3SiO(Me_2SiO)_{21}Si(OMe_3)_3$     G-1

$Me_3SiO(Me_2SiO)_{91}Si(OMe_3)_3$     G-2 wherein G-1 has a viscosity of 22 cP, and G-2 has a viscosity of 190 cP.

Examples 1-6 comprise 65-85 volume % of component (C) of thermally conductive fillers in the present compositions.

The composition of examples 1-6 are listed in table I. 0.5 g of the thermal interface material with a thickness of 75 um was sandwiched between two circular aluminum plates of diameter 12.6 mm with a thickness of 2 mm. The sample was applied by a pressure range from 20-100 psi at 25 C for 5 min and then subjected to storage modulus measurement during cure.

Thermal conductivity of the interface composition examples 1-6 was measured using NanoFlash thermal conductivity analyzer.

TABLE I

| | Examples Amount in Volume Part | | | | | |
|---|---|---|---|---|---|---|
| Compound ID | 1 | 2 | 3 | 4 | 5 | 6 |
| Compound A | | | | | | |
| A-1 | 100 | 100 | | | 150 | 180 |
| A-2 | | | 100 | 100 | | |
| Compound B | | | | | | |
| B-1 | 200 | | 220 | | | 120 |
| B-2 | | 200 | | 215 | 150 | |
| Compound C | | | | | | |
| C-1 | 50 | 50 | 100 | 100 | 100 | 150 |
| C-2 | 400 | 600 | 600 | 800 | 750 | 800 |
| C-3 | 150 | 150 | 150 | 300 | 250 | 250 |

TABLE I-continued

| | Examples Amount in Volume Part | | | | | |
|---|---|---|---|---|---|---|
| Compound ID | 1 | 2 | 3 | 4 | 5 | 6 |
| Compound D | | | | | | |
| D-1 | 4.46 | | 5.00 | | 5.35 | |
| D-2 | | 4.21 | | 5.00 | | 5.35 |
| Compound E | 0.05 | 0.055 | 0.05 | 0.055 | 0.045 | 0.05 |
| Compound F | 0.03 | 0.035 | 0.035 | 0.045 | 0.04 | 0.045 |
| Compound G | | | | | | |
| G-1 | 0.6 | 0.35 | 0.4 | 0.35 | 0.3 | 0.35 |
| G-2 | 0.6 | 0.35 | 0.4 | 0.35 | 0.3 | 0.35 |
| G' Modulus (kPa) | 68 | 72 | 74 | 92 | 82 | 91 |
| Thermal Conductivity (W/k · m) | 4.8 | 5.5 | 5.7 | 6.7 | 5.6 | 7.1 |

I claim:

1. A thermally conductive interface composition, comprising:
    (A) A linear alkenyl organopolysiloxane containing a silicon-bonded alkenyl-terminated group or groups in an average amount of 0.0001 to 5 mol % based on the amount of all silicon-bonded organic groups contained per molecule;
    (B) A branched alkenyl organopolysiloxane containing at least two silicon-bonded alkenyl groups in an average amount of about 0.01 to 1 mol % based on the amount of all silicon-bonded organic groups contained per molecule, with component (A) to (B) ratio of 20:1 to 1:20;
    (C) Thermally conductive fillers in a ternary particle size mixture with large particle in the average size range of 50-500 um, small particle in the average size range of 0.5-200 um, and nanoparticle in the average size range of 10-2000 nm;
    (D) An organohydrogenpolysiloxane containing at least two Si—H terminated groups presented at terminal or intermediate positions of the molecule, with 0.5-0.8 moles of SiH groups per mole of alkenyl groups in component (A) and (B);
    (E) An addition reaction catalyst;
    (F) A hydroxy group-containing siloxane in an amount corresponding to 0.0001-5% of the weight of component (A) and (B) combined;
    (G) A mixture of at least two alkoxy group-containing siloxanes adhering to formula (5) differing in the value of "n" added in an amount corresponding to 0.001-5% of the weight of component (C)

$(R^8O)_p SiR^9{}_{3-p}[OSiR^8{}_2]_n(OR^8)_q R^9{}_{3-q}$     (5)

wherein $R^8$ and $R^9$ represent a substituted or unsubstituted monovalent hydrocarbon group, p is an integer of 1, 2, 03, q is an integer of 1, 2, or 3, and n is an integer of 1 to 150.

2. The thermally conductive interface composition according to claim 1, wherein the thermally conductive interface composition has a thermal conductivity in the range of 1.0 to 8.0 W/m·K.

3. The thermally conductive interface composition according to claim 1, wherein the thermally conductive interface composition is interposed between electronic components and heat dissipating devices.

* * * * *